United States Patent [19]
Nishikawa et al.

[11] 4,254,389
[45] Mar. 3, 1981

[54] PUSHBUTTON TUNER HAVING TAPERING PORTION PIVOTAL PINS

[76] Inventors: Yasuhisa Nishikawa; Yoichi Ishii; Takao Kanai, all of 50 Kamitoda, Toda-shi, Saitama-ken, Japan

[21] Appl. No.: 58,630
[22] Filed: Jul. 18, 1979

[30] Foreign Application Priority Data

Jul. 21, 1978 [JP] Japan .................. 53/88268

[51] Int. Cl.³ .............................................. H03J 5/08
[52] U.S. Cl. ................................... 334/7; 74/10.33
[58] Field of Search ................. 334/7; 74/10.33, 10.37

[56] References Cited
U.S. PATENT DOCUMENTS 4,161,707   7/1979   Kanai et al. ............................... 334/7

Primary Examiner—Paul L. Gensler
Attorney, Agent, or Firm—Wallenstein, Spangenberg, Hattis & Strampel

[57] ABSTRACT

A pushbutton tuner wherein a plurality of tilting actuating links are provided for a slide member for causing cores to move in-and-out of coils and the actuating links are adapted to engage setting pins of frequency regulating members respectively, which are provided on button slides actuatable by push buttons, respectively to effect a selection operation, which tuner is characterized in that a pivotal pin fitted in a hole formed in each of the frequency regulating members has a tapering portion and each of the setting pins also has a tapering portion at a portion where the setting pin engages the actuating link associated therewith.

2 Claims, 4 Drawing Figures

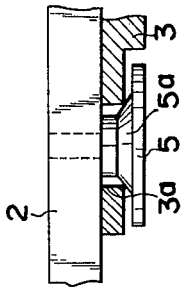
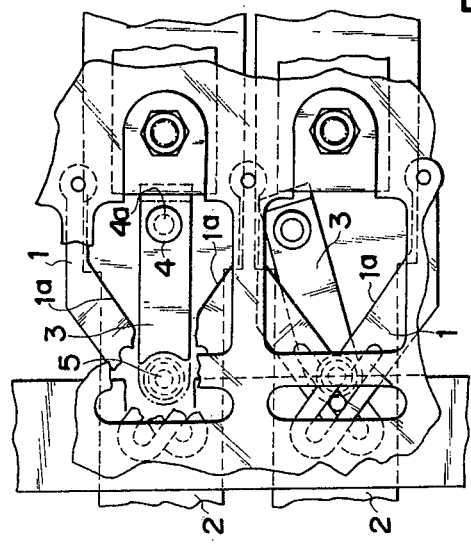
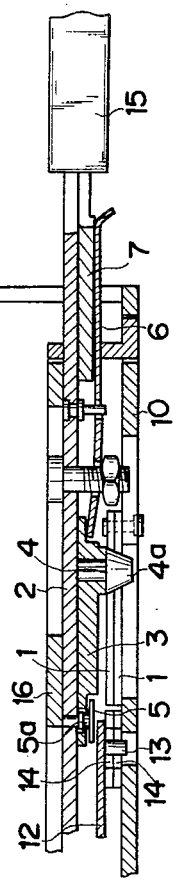

PUSHBUTTON TUNER HAVING TAPERING PORTION PIVOTAL PINS

TECHNICAL FIELD

This invention relates to a pushbutton tuner and more particularly to a mechanism for eliminating a tuning deviation or error of the pushbutton tuner.

BACKGROUND ART

Generally, in a pushbutton tuner, cores are moved in-and-out of coils by a core slide, the core slide is actuated by actuating links provided at positions interior of a tuner housing, namely, rearward of button slides, and the actuating links are actuated by setting pins provided on frequency regulating members, respectively, which are in turn provided on the button slides, respectively. Base end portions of the frequency regulating members are connected to the button slides by pivotal pins, respectively. Either of the setting pin and the pivotal pin has a cylindrical periphery extending in parallel with the axis thereof. Upon careful observation and study of such a known pushbutton tuner by the inventors of the present invention, it has been found that the known pushbutton tuner involves a possibility of tuning error (F deviation) in an actual selection operation and has such a disadvantage that a desired tuning cannot be always obtained.

The invention has been achieved upon study of these facts. The study has been first made as to why and how such tuning deviation or error is caused in the pushbutton tuner and it has revealed that while the frequency regulating member is fastened and held face to face by a head of the pivotal pin of cylindrical shape, it may possibly be rotated and since the angle of the frequency regulating member is required to be reset or changed, gaps are left around the periphery of the pivotal pin and from the face of the head, respectively, so that the possibility of tuning deviation or error is further increased. As to the setting pin, when it is brought into engagement with the edges of the actuating links for carrying out a selection operation, the frequency regulating member is caused to receive a considerable resistance at the tip end portion thereof under an unstable state at the base end thereof. Therefore, the setting pin will possibly disengage from the button slide so that stable and accurate selection operation cannot be expected.

SUMMARY OF THE INVENTION

It is therefore an object of the invention to provide a pushbutton tuner having a mechanism for positively eliminating a tuning deviation or error in the pushbutton tuner.

In accordance with the invention, there is provided a pushbutton tuner comprising a plurality of tuning coils; cores adapted to move in-and-out of the coils, respectively; a slide member for displacing said cores relative to said coils, respectively; a plurality of pairs of actuating links engaged with said slide member, said actuating links of each pair being crossed each other at the point where the links engage the slide member and pivotal set relative to each other; a plurality of button slides; push buttons provided on the button slides, respectively; frequency regulating members pivotally connected to the button slides, respectively; setting pins provided on said frequency regulating members, respectively, and adapted to engage with the crossing points defined by respective pairs of the actuating links; and pivotal pins for pivotally connecting said frequency regulating members to said button slides, respectively; which tuner is characterized in that each of said pivotal pins is formed with a head having an adjacent tapering portion usable to pivotally connect the frequency regulating member to the button slide.

BRIEF DESCRIPTION OF THE DRAWINGS

FIG. 2 is a fragmentary partly cut away plan view of the pushbutton tuner illustrated in FIG. 1.

FIG. 3 is a sectional view of a button slide and a frequency regulating member employed in the pushbutton tuner.

FIG. 4 is an enlarged sectional view of a pivotal pin employed in the pushbutton tuner.

DETAILED DESCRIPTION OF THE INVENTION

Figure 1:
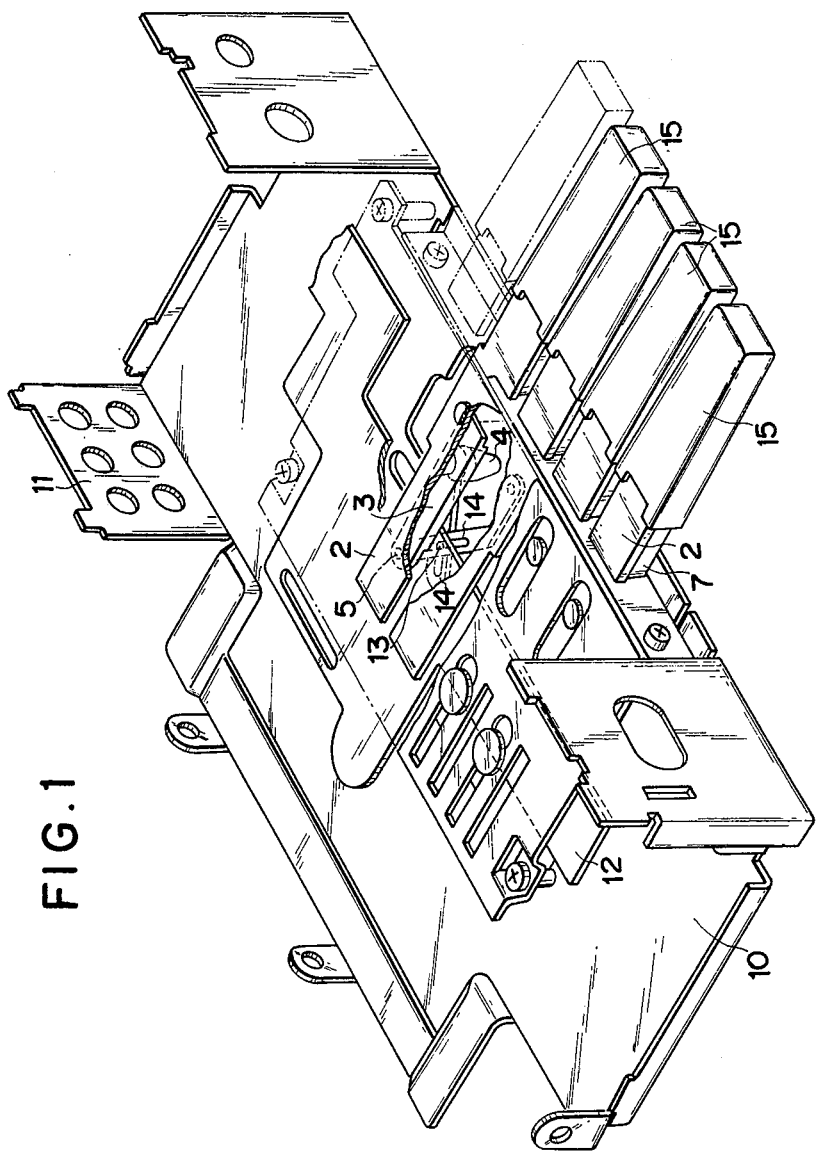
FIG. 1 is a partly cut away perspective view of one form of a pushbutton tuner in accordance with the present invention.

A general arrangement of a pushbutton tuner is as illustrated in FIG. 1. A baseplate 10 has at one side thereof a coil seat 11. Coils (not shown) are mounted on the coil seat 11 and cores are adapted to enter or exit relative to the coils by a displacing member (not show). The displacing member is in turn actuated by a slide member 12 mounted on the baseplate 10. A pin 13 provided on the slide plate 12 is engaged at elongated slots 14, 14, with rear ends of actuating links 1, 1, which are tilted so as to cross each other as can be seen from FIG. 2. The actuating links 1, 1 each have an engaging edge 1a which is adapted to engage a setting pin 4 of a frequency regulating member 3. The frequency regulating member 3 is provided on each of button slides mounted on the baseplate. Thus, the setting pin 4 can carry out a selection operation.

In accordance with the invention, the frequency regulating member 3 is pivotally connected to the button slide 2 at a tapering portion 5a adjacent to a head portion of a pivotal pin 5 as illustrated in an enlarged scale in FIG. 4. More specifically, the tapering portion 5a of the pivotal pin 5 abuts against a wall of a slot 3a formed at the base portion of the frequency regulating member 3. A similar truncated conical tapering portion 4a is formed also on the setting pin 4 provided at the tip end portion of the frequency regulating member at least at a portion where it contacts the actuating links 1, 1.

In the pushbutton tuner as illustrated, 6 is a resilient plate whose rear end rests on the tip end portion of the frequency regulating member 3 and whose forward end rests on a slide metal 7 which is attached to the button slide 2 and adapted to slide conjointly with a push button 15. When the slide metal 7 is pushed inwardly with the push button 15, the forward end of the resilient plate 6 is raised and the rear end of the resilient plate 6, which is secured intermediate thereof to the button slide 2, holds and locks the free end of the frequency regulating member 3. On the other hand, when the slide metal 7 is pulled forwardly, the locking is released so that the set angle of the frequency regulating member 3 with the button slide 2 may be changed suitably in the same manner as known.

In accordance with the arrangement of the present invention, the frequency regulating member 3 is pivotally connected through engagement of the tapering portion 5a of the pivotal pin 5 with the wall of the slot 3a to form an angular connection between the pivotal pin 5 and the wall of the slot 3a. Accordingly, the connection can be tight, allowing the set angle of the frequency regulating member 3 to be adjusted. The frequency regulating member 3 thus tightly fastened as illustrated in FIG. 4 is stable with respect to the button slide 2 producing no looseness. Moreover, please note that the setting pin 4 provided at the tip end portion of the frequency regulating member 3 is also formed with the tapering portion 4a of truncated conical shape. This tapering portion 4a is brought into contact with the engaging edge 1a of the actuating link 1 for carrying out selection operation and causes the cores to move relative to the coils through the slide member 12. During the actuation of the actuating link 1, a force component for pressing the frequency regulating member 3 against the button slide 2 is exerted by the tapering portion 4a. Accordingly, in the resistive operation of the actuating link 1, the tip end portion of the frequency regulating member 3 will not disengage any more. Furthermore, as mentioned above, the frequency regulating member 3 is stably held by means of the pivotal pin 5 so that the frequency regulating member 3 is always in a properly set position when the selection operation is carried out. Therefore, accurate selection is attained without causing tuning deviation or tuning error. Furthermore, such a mechanism for eliminating the tuning deviation is simple in construction and is by no means obstructive to resetting of the frequency regulating member 3 or even more convenient for the resetting.

We claim:

1. A pushbutton tuner comprising a plurality of tuning coils; cores adapted to move in-and-out of the coils, respectively; a slide member for displacing said cores relative to said coils, respectively; a plurality of pairs of actuating links engaged with said slide member, said actuating links of each pair being crossed each other at the point where the links engage the slide member and pivotal relative to each other; a plurality of button slides; push buttons provided on the button slides, respectively; frequency regulating members pivotally connected to the button slides, respectively; setting pins provided on said frequency regulating members respectively, and adapted to engage with the crossing points defined by respective pairs of the actuating links; and pivotal pins for pivotally connecting said frequency regulating members to said button slides, respectively; which tuner is characterized in that each of said pivotal pins is formed with a head having an adjacent tapering portion usable to pivotally connect the frequency regulating member to the button slide.

2. A pushbutton tuner as set forth in claim 1, wherein said setting pins each have a tapering portion for engagement with the crossing point of the actuating links.

* * * * *